(12) United States Patent
Hsiao et al.

(10) Patent No.: US 7,614,521 B2
(45) Date of Patent: Nov. 10, 2009

(54) PLATFORM AND MULTIPLE BOX CASE

(75) Inventors: John Hsiao, Azusa, CA (US); Mario Montano, Azusa, CA (US)

(73) Assignee: Hsiao and Montano, Inc., Azusa, CA (US)

( * ) Notice: Subject to any disclaimer, the term of this patent is extended or adjusted under 35 U.S.C. 154(b) by 820 days.

(21) Appl. No.: 11/336,670

(22) Filed: Jan. 20, 2006

(65) Prior Publication Data

US 2007/0170181 A1   Jul. 26, 2007

(51) Int. Cl.
- B65D 43/20 (2006.01)
- B65D 43/22 (2006.01)
- B65D 6/28 (2006.01)
- B65D 1/24 (2006.01)

(52) U.S. Cl. .................. 220/345.2; 206/745; 220/4.27; 220/23.83; 220/812; 220/324

(58) Field of Classification Search .............. 220/345.1, 220/4.27, 23.83, 5.4, 812, 324, 811, 522, 220/540; 206/749, 745
See application file for complete search history.

(56) References Cited

U.S. PATENT DOCUMENTS

| | | | | |
|---|---|---|---|---|
| 3,961,723 A | * | 6/1976 | Eckel | 220/812 |
| 4,014,457 A | * | 3/1977 | Hodge | 220/812 |
| 5,004,105 A | * | 4/1991 | Freadman | 206/576 |
| 5,353,947 A | * | 10/1994 | Zinnbauer et al. | 220/812 |
| 5,975,334 A | * | 11/1999 | Mayo | 220/592.03 |
| 6,129,231 A | * | 10/2000 | Hsiao et al. | 220/345.2 |
| 6,193,062 B1 | * | 2/2001 | Rysgaard et al. | 206/315.11 |
| 6,817,623 B1 | * | 11/2004 | Gerutto | 280/655.1 |
| 2005/0092763 A1 | * | 5/2005 | Haggerty et al. | 220/912 |

* cited by examiner

*Primary Examiner*—Anthony D Stashick
*Assistant Examiner*—Niki M Eloshway
(74) *Attorney, Agent, or Firm*—Charles C. H. Wu; Wu & Cheung, LLP

(57) ABSTRACT

The present invention relates generally a platform and multiple box case for housing electronic and acoustical equipment for stationary and transitional operations, and more particularly to offer an apparatus for safely and adjustably providing an upper platform mated to the upper and lower boxes of the multiple box case. Traditional types of cases and racks are suitable for typical audio gears in the DJ field. However, more users of such boxes are using laptop computers and other accessories. Yet, such users are discovering that traditional boxes lack the space for such devices on the typical cases that they are currently utilizing. The present invention provides a solution for the placement of additional gears in a variably slidable platform without taking any more space than in typical DJ boxes.

23 Claims, 15 Drawing Sheets

Top View

PLATFORM AND MULTIPLE BOX CASE

BACKGROUND OF INVENTION

1. Field of the Invention

The present invention relates generally a platform and multiple box case for housing electronic and acoustical equipment for stationary and transitional operations, and more particularly to offer an apparatus for safely and adjustably providing an upper platform mated to the upper and lower boxes of the multiple box case. Traditional types of cases and racks are suitable for typical audio gears in the DJ field. However, more users of such boxes are using computers laptop and other accessories. Yet, such users are discovering that traditional boxes lack the space for such devices on the typical cases that they are currently utilizing. The present invention provides a solution for the placement of additional gears in a variably slidable platform without taking any more space than in typical DJ boxes.

2. Description of the Related Art

Equipment cases that transport, for example, audio devices have long been designed to permit full operation of such devices without removing a device from its case. This is accomplished by structuring the case in, say, two device-containing boxes, one of which is then offset from the other in an operating position to reveal the elements of said devices or equipment for access by an operator.

Widely used in the field of the personal delivery of recorded music to audiences by, for example, on-location disc jockeys, such box cases have traditionally permitted an operator the choice between two and only two stable modes. In the first of these, the transport mode, the upper box of the case is mated with the lower box, usually a small number of hook and latch fasteners, typically two on each of the two opposing sides, each latch engaging only one transport hook. The equipment within each case box is generally hidden from view and thereby protected for transportation.

In the other of the two states, viz., the operating mode, the latches on the upper box of the base are disengaged from the lower box transport hooks, and the upper box is removed and thus exposing the equipment in the lower box for operation.

An example of the foregoing traditional box case is the Genesis ST-17A, a 17 space DJ case sold by Genesis of Los Angeles, Calif. An upper box of the case is offset by approximately one-half its depth to achieve an operating position that is limited to the discrete location allowed by the placement of the operating hooks. These hooks are fastened, one on each side of the lower box, approximately midway between the two transport hooks. For each side, the frontmost latch, the one that had engaged the frontmost transport hook in the transport mode, now engages the operating hook, while the other (rearmost) latch has nothing to engage, being located on that portion of the upper box that is cantilevered out from the lower box. The operator is thus restricted to a single, fixed operating position. Moreover, relying on such a single point of contact on each side of a case to secure a heavy case box may result in undesirable and potentially dangerous loss of stability should any such contact point fail. Conversely, the present invention allows the placement of laptop or other accessories on a platform capable of variable sliding movement resulting in multiple horizontal adjustment points in accordance with user selected comfort level while still allowing access to the lower box area. Additionally, the user will not be constrained with only one selected point position so that multiple sizes of computers or other accessories may be used in conjunction with the present invention without manually resetting the balance position of the upper and lower boxes.

A more versatile arrangement, allowing for enhanced flexibility in the location of the upper box in the operating mode, is embodied in, for example, the Odyssey SS-1702 DJ case sold by Odyssey Designs of Azusa, Calif. A channel or slider member channel is mounted along the top of each of the sides of the lower box, essentially extending over most of the depth of each side. The slider member channel, which serves as a continuous "hook" for both transport and operation, permits the operator to choose a variety of operating positions by positioning the frontmost of the latches on the upper box to engage the lower box member anywhere along its entire length. The operator may thus adjust the position of the upper box to suit his or her personal preference. However, as in the Genesis design described above, only a single point of contact, viz., the frontmost latch on each side of the upper case, is being relied on for securing the boxes to each other. Moreover, the greatly extended length of the slider member channel may in fact contribute to an increased likelihood of the case tipping over should the operator offset the upper box too far to the rear of the lower box. Furthermore, this invention has the disadvantage of not allowing the user to operate a laptop or other accessories in tandem with the operation of audio equipments while in the field, because a variably adjustable platform for such use is not provided.

Other devices related to moving a box-like article relative to other parts in an assembly include a variety of complex devices employing roller bearings and races. For example, U.S. Pat. No. 5,275,492 to Shirai teaches a slide unit mounted on a guide rail by rolling members and requiring grease nipples for lubrication. Similarly, U.S. Pat. No. 5,344,228 to Kovarik et al. teaches an arrangement of channel members, for separate sets of ball bearings, an intermediate slide member and first and second raceways to facilitate movement of a drawer relative to a stationary base.

Accordingly, it is an object of the present invention to provide a case for transporting and operating electronic and acoustic equipment that overcomes the cost and safety problems that are characteristic of the prior art.

A second object of this invention to provide an equipment case that is more multi-functional than conventional cases when in field use, and which permits the operator a comfortable degree of continuous adjustment of a platform for computers and other accessories in an operating position that suits his or her own preference, while maintaining an ergonomic and stable arrangement of the case in the operating mode.

SUMMARY OF THE INVENTION

A case for housing audio and electronic equipment during stationary and transitional operations having lower and upper boxes with an upper platform that may be variably shifted rearward or forward along the lower box to expose the equipment devices in the lower box for operation and to provide a platform for electronic devices and other accessories. A lower slider member channel having an outwardly projecting angled flange is mounted along the upper edge of each side surface of the lower box. Additionally, an upper slider member channel having a protruding longitudinally extending web is mounted along the lower edge of each side surface of the upper platform.

When the latches are disengaged and upper box removed, the upper platform could be shifted rearward or forward in a variable horizontal movement. The continuity of the upper and lower slider member channels attached to said platform and lower box is frictionally engaged along its length, thereby permitting an operator to select variable positions to suit his or her preference. Therefore, the slider member channel assembly will include at least a first or upper slider member channel and second or lower slider member channel which telescopically slides in the lower slider member channel in a longitudinal axial direction. The upper slider member channel includes a center span or web. The lower slider member channel includes an outwardly projecting angled flange. The center web and angled flange are in opposed, generally parallel relation to one another and slide longitudinally with respect to each other as the channels slide.

According to another aspect of the invention, the upper slider member channel has a linear series of shallow concave safety stop holes pre-drilled below and parallel to the flange portion of the member. A spring loaded metal ball tightly fitted in a hole sufficient to hold said spring in the edge top of the box sides is recessed but slightly protruding there-through the lower slider member channel to frictionally engage said safety stop holes and the bottom flange portion of said lower slider member channel to allow a smooth and fluid movement of the upper platform.

According to another aspect of the invention, a safety stop angular hole is substantially near one of the terminal ends of the upper slider member channel and is sufficiently close to said member flange that a cantilever biased lever will engage said angular hole at the most extended outward position.

These and other features of the present invention will become apparent from the following Description and an Exemplary Embodiments when taken in conjunction with the claims and drawing figures herein described.

BRIEF DESCRIPTION OF THE DRAWING FIGURES

DESCRIPTION OF THE PREFERRED EMBODIMENTS

Figure 1:
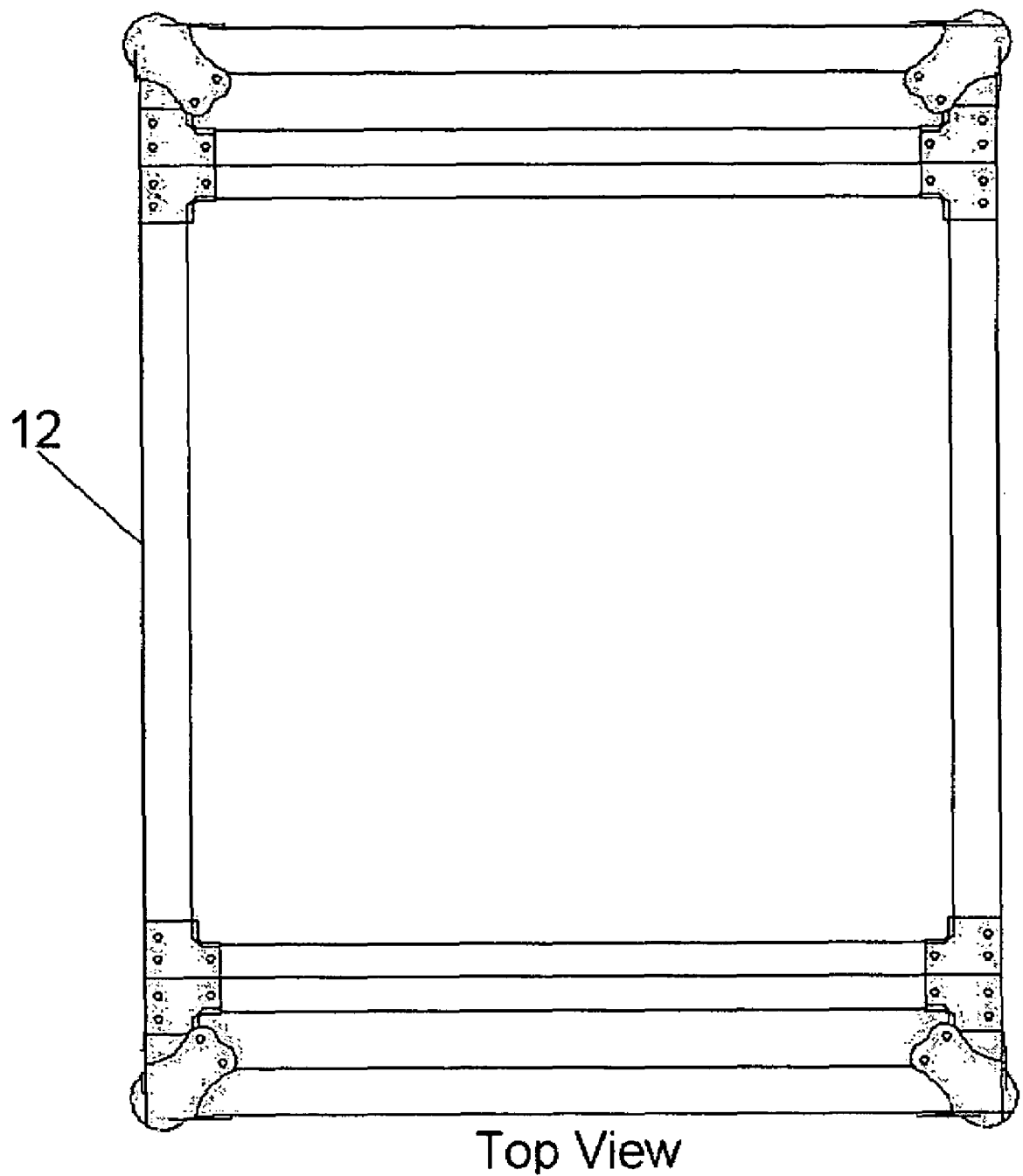
FIG. 1 is a top view of a platform and multiple box case in the first preferred embodiment.
Figure 2:
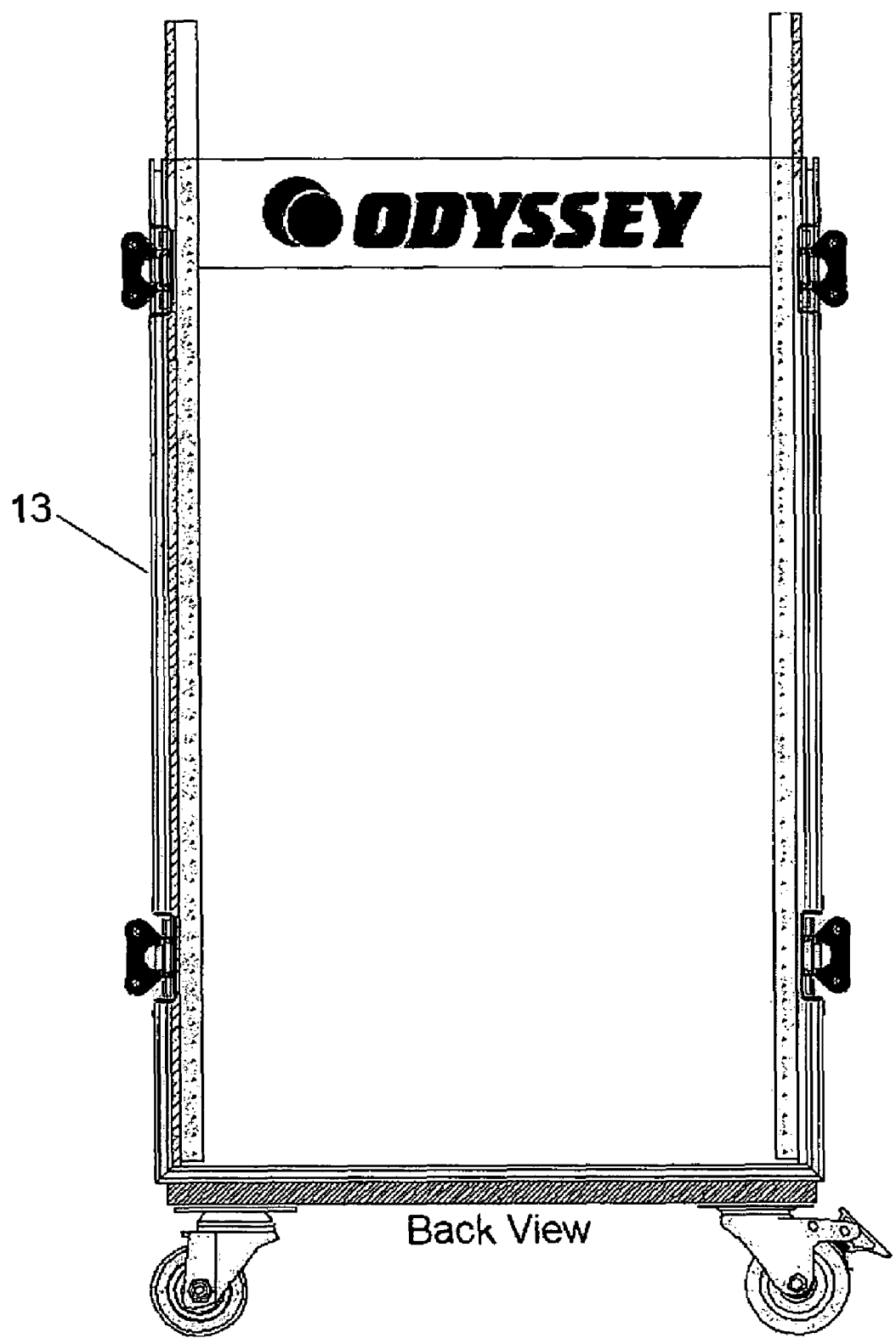
FIG. 2 is a back view illustrating the lower box with the upper box removed in the first preferred embodiment.
Figure 3:
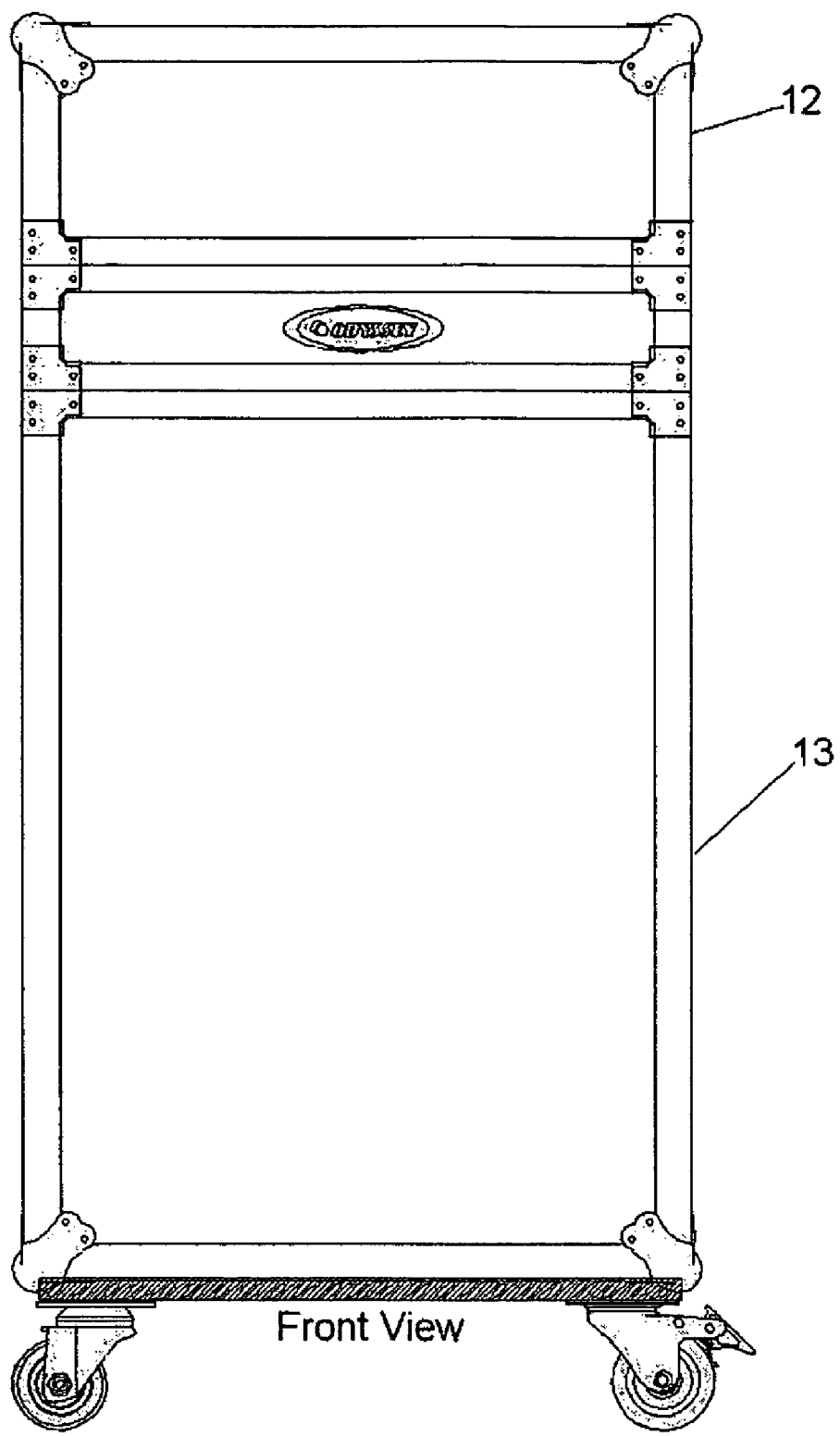
FIG. 3 is a front view illustrating the lower box and the upper box in its assembled state in the first preferred embodiment.

An improved equipment case 10 for transporting and operating audio and electronic devices for disc jockeys and the like is shown in FIG. 1. The present invention relates to apparatus for securely closing the equipment case 10 in a transport mode, and for safely exposing the devices in a lower box in an operating mode. Access to devices on an upper platform 11 is typically gained through one or more panels on the surfaces of the upper box 12 as is well known in the art, the placement of which doors is not critical with respect to the present invention.

Figure 4:
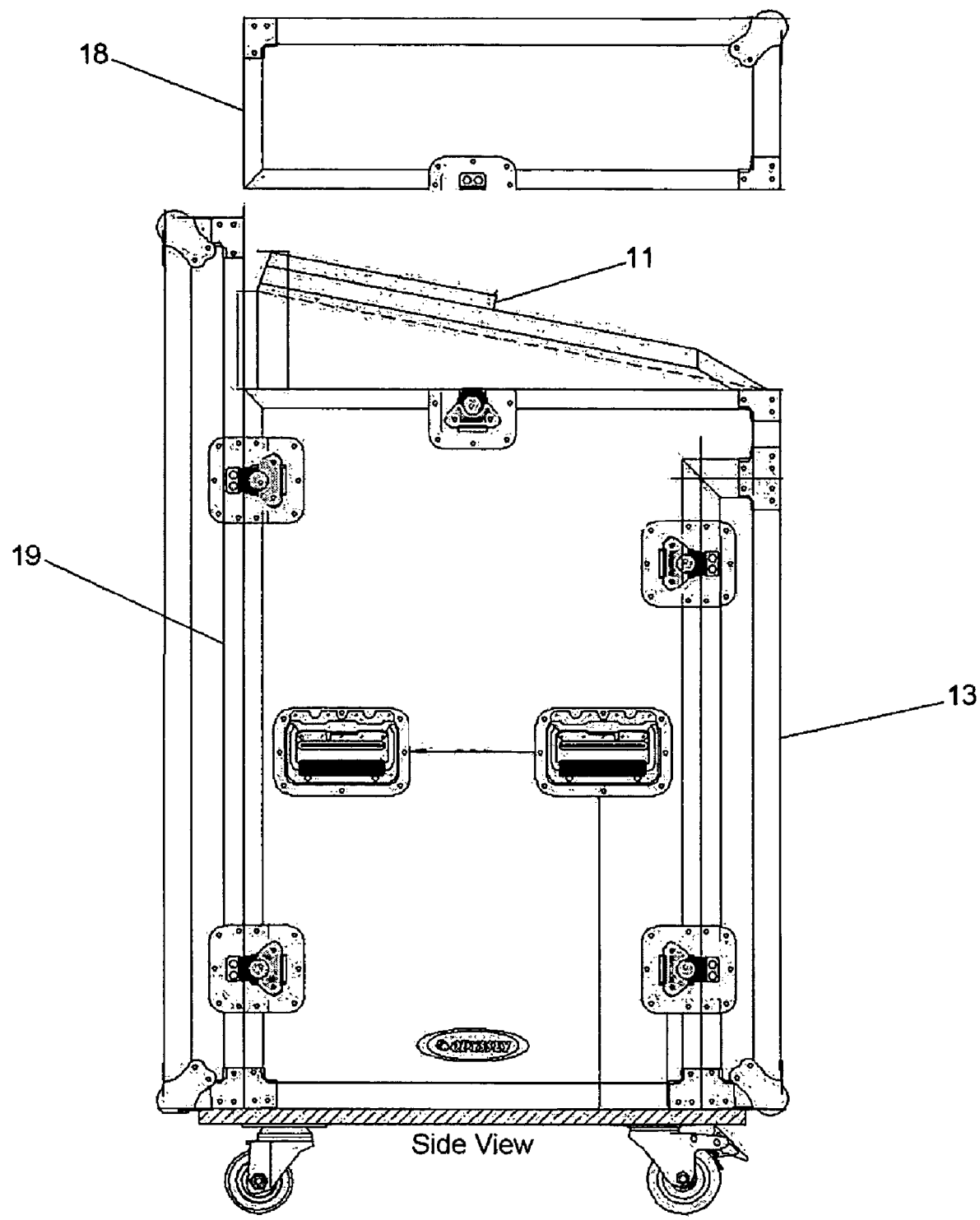
FIG. 4 is a side view illustrating the platform, lower box, and upper box in its assembled state with the upper box raised to expose the complete platform for ease of illustration in the first preferred embodiment.
Figure 5:
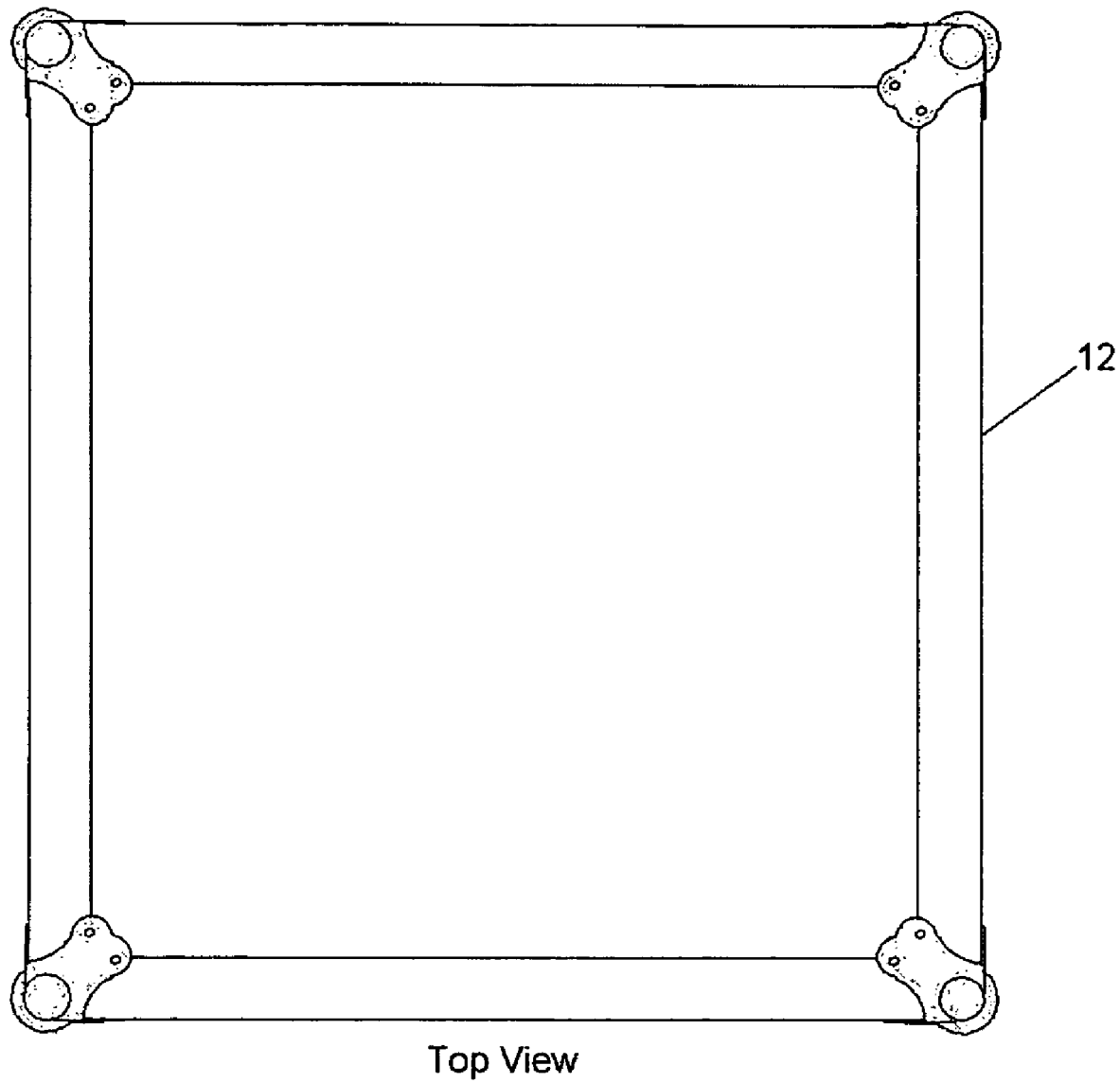
FIG. 5 is a top view of a platform and multiple box case in the second preferred embodiment.
Figure 6:
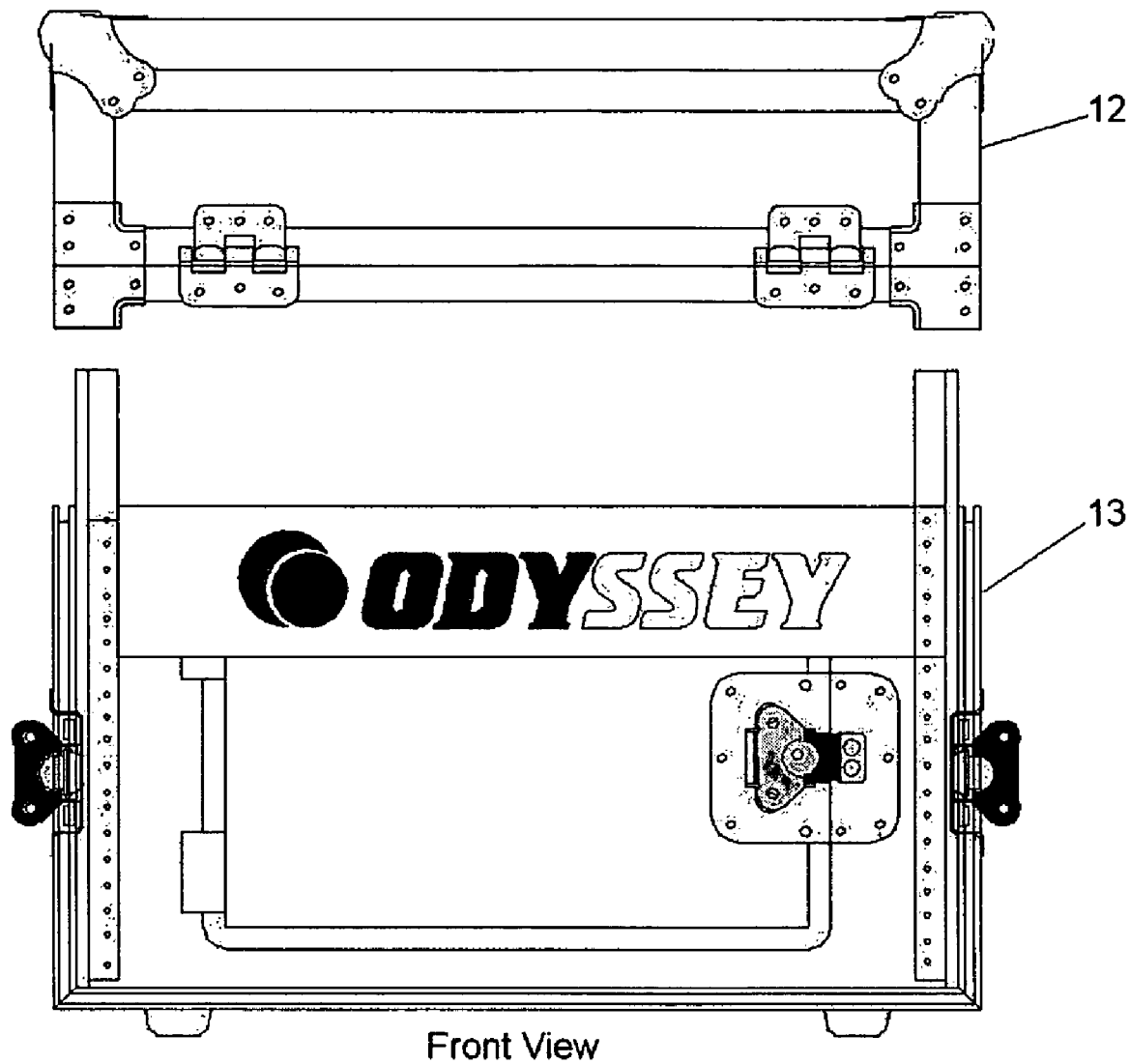
FIG. 6 is a front view illustrating the lower box with the upper box in an offset position for ease of illustration in the second preferred embodiment.
Figure 9:
FIG. 9 is a bottom plan view of the lower slider element in its unassembled state in the first and second embodiments.

Referring now to FIG. 4, the upper platform 11 is supported above the lower box 13 in a stationary or transitional mode. The upper platform is held securely together with the lower box when being transported from place to place by the frictional engagement of the upper slider member 14 (shown in FIG. 11) fastened to the upper platform 11 with the lower slider member 15 (shown in FIG. 11) fastened to the lower box 13. While the upper platform 11 is in the stationary or transitional mode, the upper slider member channel 14 (shown in FIG. 11) is in engagement with the lower slider member channel 15 (shown in FIG. 11). By sliding outward into the cantilever spring lever member 16 (shown in FIG. 10), the said lever member engage in a tight secure position with the upper slider member channel 14 (shown in FIG. 11). Thus, the cantilever spring lever member 16 (shown in FIG. 10) locks the upper platform 11 (shown in FIG. 11) to the lower box 13. By sliding inward, the cantilever spring lever members 16 (shown in FIG. 10) are moved away from the slider member channel. Thus, the cantilever spring lever members 16 (shown in FIG. 10) are no longer in contact with the safety angular stopping hole 17 (shown in FIG. 9) and therefore, slides freely engaged to the upper slider member channel 14 (shown in FIG. 11).

Although right side surfaces 18 and 19 (shown in FIG. 4) of the upper and lower boxes, respectively, are shown for purposes of illustration, the discussion herein applies equally to the latches and slider member channel that are mounted on the left side surfaces (not shown) of the boxes.

Figure 7:
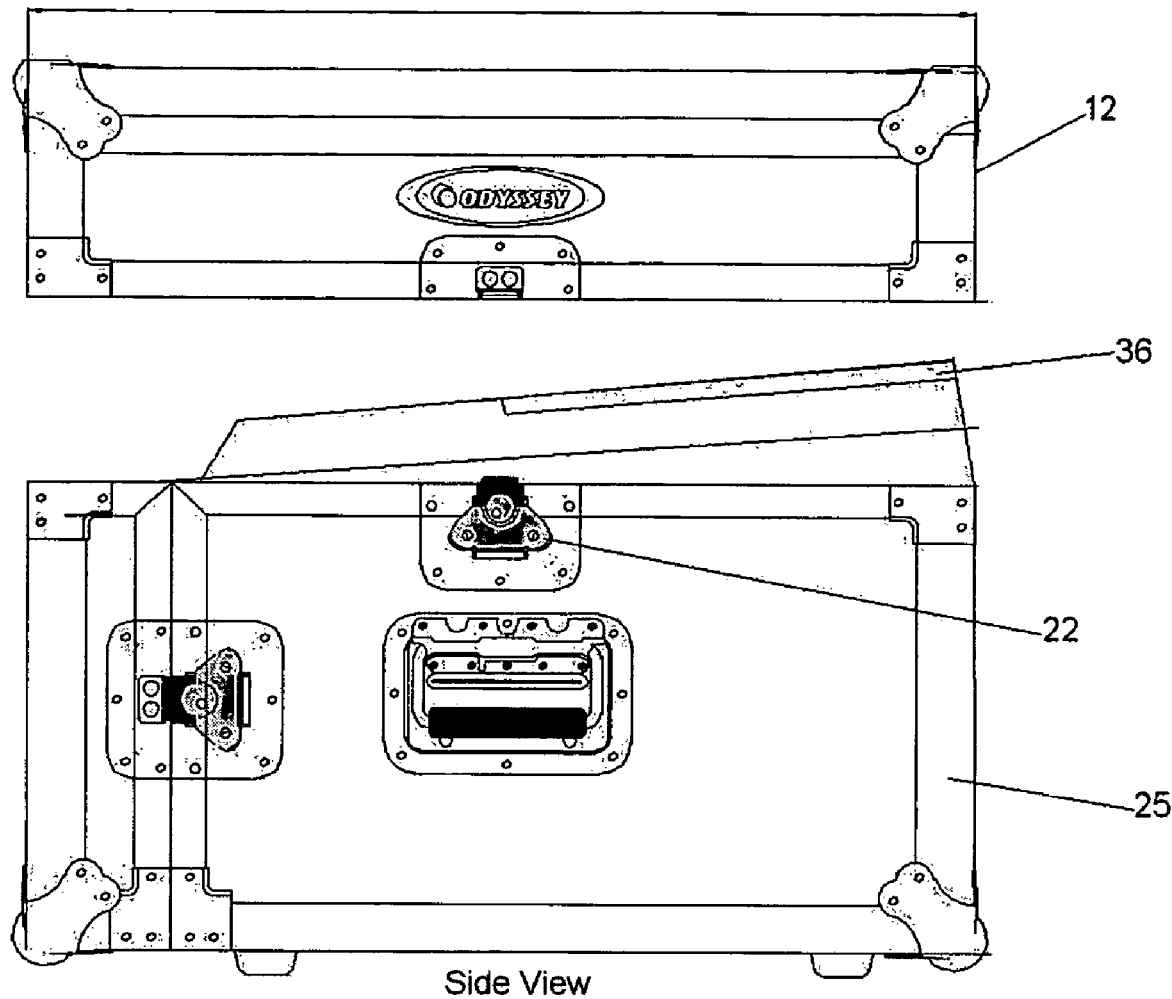
FIG. 7 is a side view illustrating the platform, lower box, and upper box in its assembled state with the upper box raised to expose the complete platform for ease of illustration in the second preferred embodiment.
Figure 11:
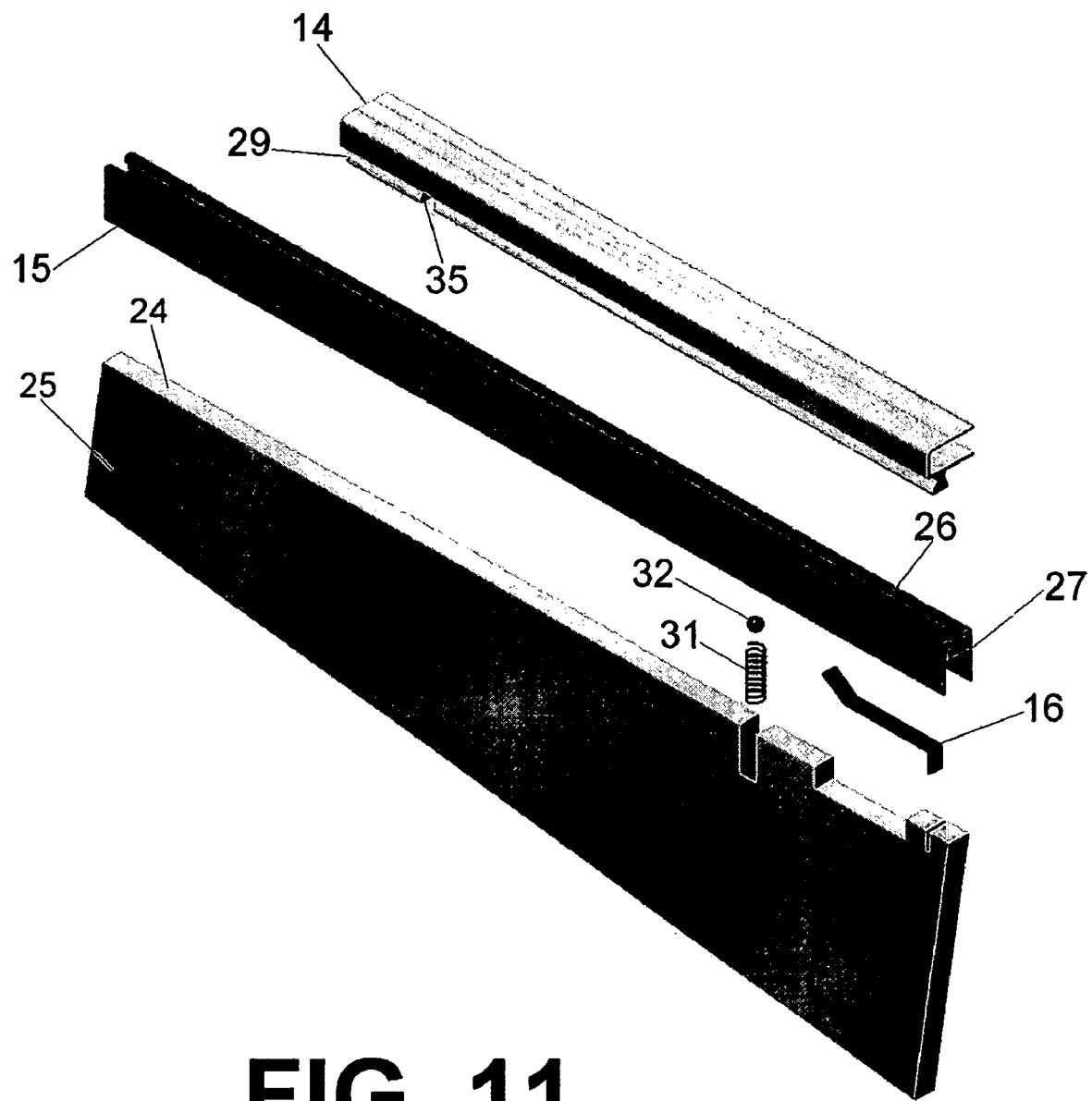
FIG. 11 is a perspective view of the top side portion of the lower box with the spring, metal ball, cantilever level, lower slider element, and upper slider element positioned adjacent to each other in their unassembled state for ease of illustration in the first and second embodiments.
Figure 12:
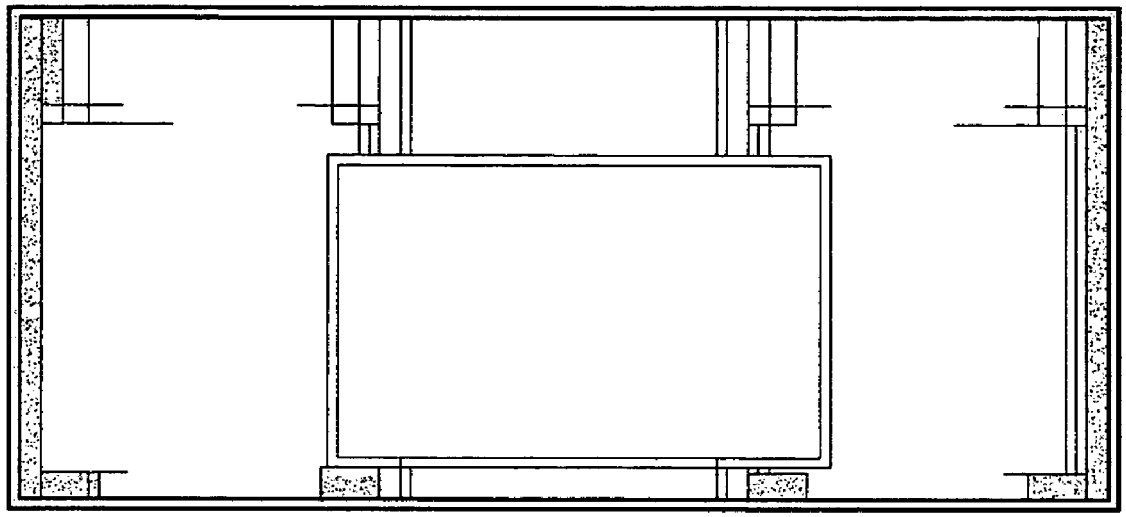
FIG. 12 is a top plan view of the platform and multiple box case in the second embodiment.
Figure 12:
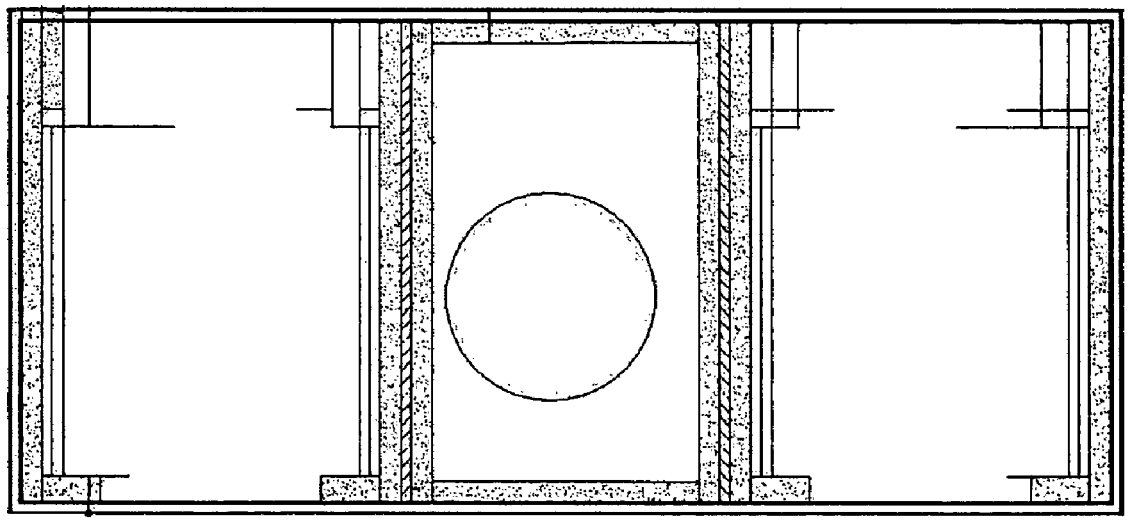
Figure 13:
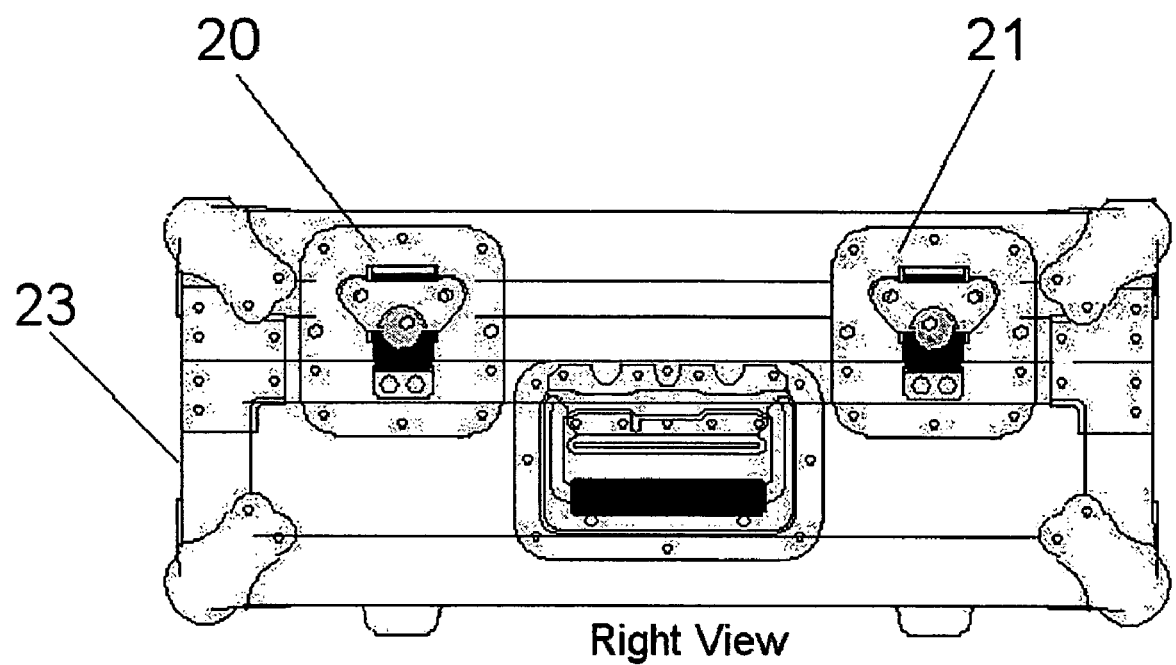
FIG. 13 is a right side elevation view of the platform and multiple box case in the second embodiment.

Now referring to FIG. 13, first latch 20, the side latch, is disposed in close proximity to second latch 21, both latches being located in engagement near the slider member channels 14, 15 (shown in FIG. 11). Third latch 22 (shown in FIG. 7) is remote from first and second latches 20, 21 near the center of the side box. All of the latches 20, 21, 22 (shown in FIG. 7) and the corresponding latches (not shown) mounted on the left side surfaces are in a locked or engaging condition as illustrated in FIG. 13. When the latches 20, 21, 22, (shown in FIG. 7) are thus positioned as shown in FIG. 13, the equipment case 23 is thereby locked in the transitional mode.

Figure 10:
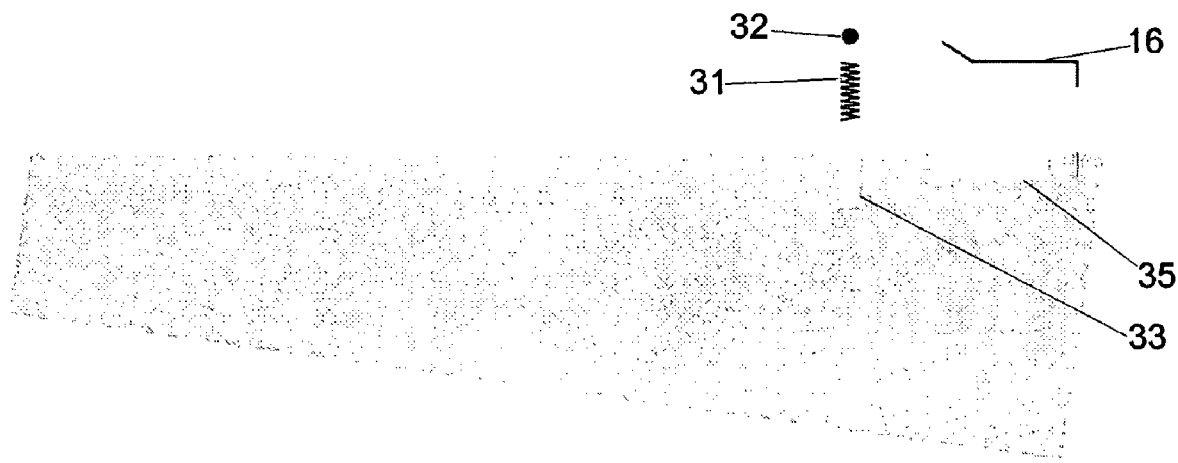
FIG. 10 is a side elevation view of the top side portion of the lower box with the spring, metal ball, and cantilever lever positioned adjacent to each other in their unassembled state for ease of illustration in the first and second embodiments.

Now referring to FIG. 11, the configuration of upper slider member channel 14 and lower slider member channel 15 is more clearly seen in FIGS. 10 and 11. The material of lower slider member channel 15 may consist of extruded aluminum or other light, strong material that can be affixed to the top 24 of the lower box 25 by mounting fasteners. The material of upper slider member channels 14 may consist of extruded aluminum or other light, strong material that can be affixed to the sides of the upper platform 36 (shown in FIG. 7) by mounting fasteners.

Figure 8:
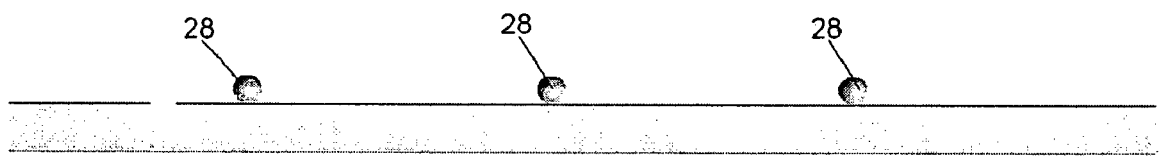
FIG. 8 is a bottom plan view of the upper slider element in its unassembled state in the first and second embodiments.

Still referring to FIG. 11, the continuous flange 26 projects upwardly from the upper edge 27 of the lower slider member channel 15. A linear series of pre-drilled holes 28 (shown in FIG. 8), either blind or, if more economical, drilled through the upper slider member channel 14, is disposed parallel to the continuous web 29. The series of holes 28 (shown in FIG. 8) is arranged along a two-third length of said upper slider member channel 14 nearest to the terminal end containing the angular hole 30 (shown in FIG. 9).

Now referring to FIG. 10, the spring 31 and metal ball 32 assembly is recessed within a bore 33 in the top of each side 24 (shown in FIG. 11) of the lower box and extended there-through the lower slider member channel 15 (shown in FIG. 11) via pre-drilled hole 34 (shown in FIG. 9) with the metal ball 32 situated slightly above the planar surface 27 (shown in FIG. 11) of the lower slider member channel 15 (shown in FIG. 11). The cantilever spring lever 16 is situated within an angular depression 35 in the upper planar surface of each side of the upper portion 24 (shown in FIG. 11) of the lower box and upper free end of said cantilever spring level 16 is extended there-through the lower slider member channel 17 (shown in FIG. 9) via angular hole 30 (shown in FIG. 9) so that when in extended position said cantilever lever 16 will engage the safety stop hole 35 (shown in FIG. 11) in the upper slider member channel 14 (shown in FIG. 11).

Figure 14:
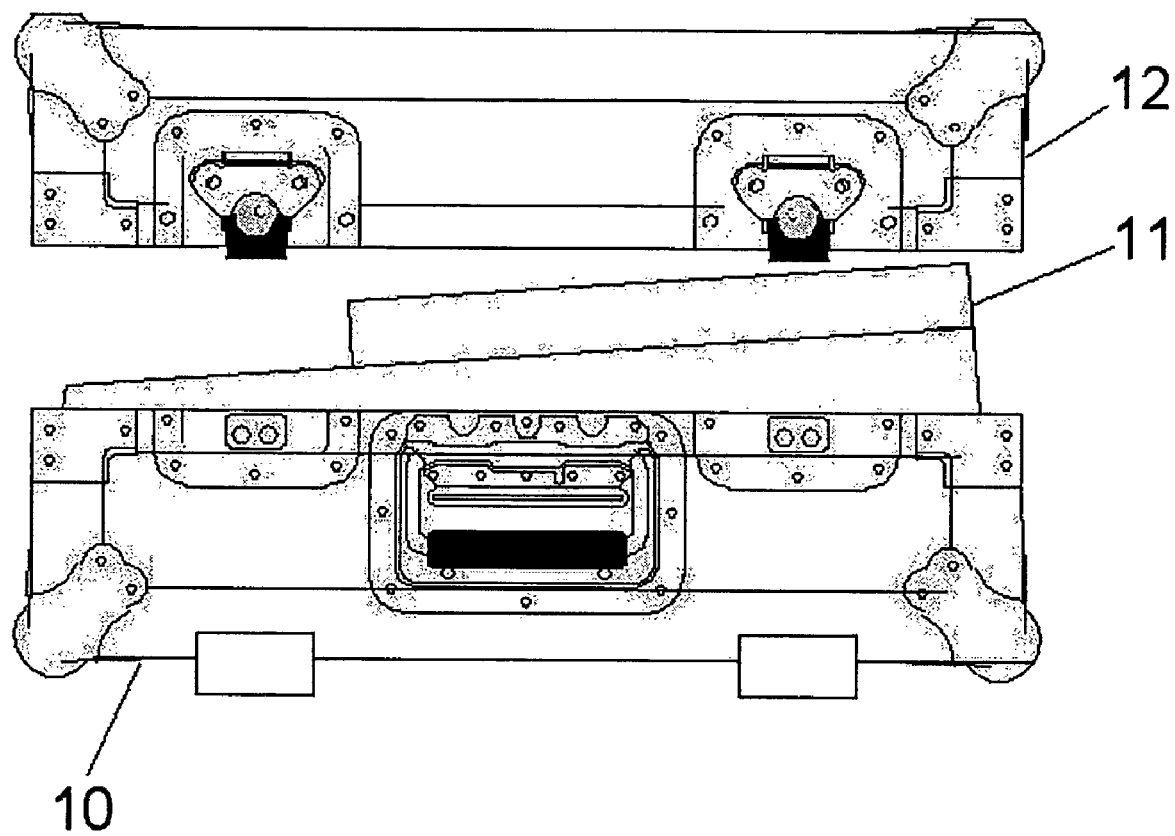
FIG. 14 is a right side elevation view of the platform and multiple box case exposing the upper platform with the upper box raised for ease of illustration in the second embodiment.
Figure 15:
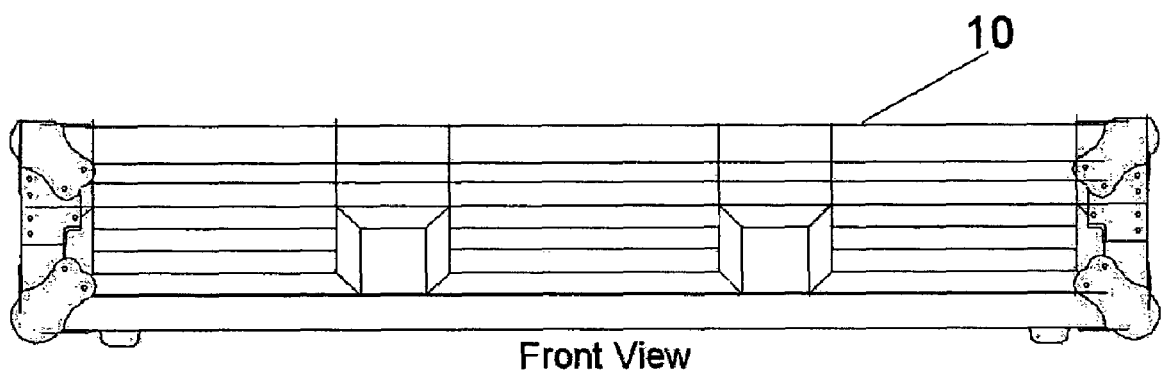
FIG. 15 is a front elevation view of the platform and multiple box case in the second embodiment.

Now referring to FIG. 14, to quickly and easily position a laptop or accessories in the case 10 for performance, the operator merely disengages the latches and extends the upper platform 36 (shown in FIG. 7) to the user's desired extended position for supporting a wide variety of shapes and sizes of computers and accessories.

Other embodiments of the invention will appear to those skilled in the art from consideration of the specification and practice of the invention disclosed herein. Possible applications of the platform and multiple box case include, but are not limited to, case for travel, case for office use, case for home use, and case for educational use. It is intended that the specification and examples are to be considered as exemplary only, with a true scope and spirit of the invention being indicated by the following claims.

What is claimed is:

1. A platform and multiple box combination case and multiple box combination case for housing audio and electronic equipments in stationary and transitional modes, said platform having a forward and rearward aspect and comprising:
    a lower box having an open top and side edge defining a border of said top on each of two side surfaces, said box containing at least one audio or electronic device;
    at least one upper platform having a bottom surface and a side edge defining a border of said bottom surface on each of two side surfaces of said upper platform, said upper platform containing at least one electronic or accessory device capable of operating with said lower box device;
    an upper box having an open bottom and side edge defining a border of said bottom on each of two side surfaces, said box contains a concave space for housing at least one audio or electronic device when in a closed position;
    a slider member channel assembly comprising at least a first or upper slider member channel and second or lower slider member channel which telescopically slides in the lower slider member channel in a longitudinal axial direction which the upper slider member channel includes a center span or web and the lower slider member channel includes an outwardly projecting angled flange being formed along and in an acute angle relationship with an upper rim thereof, and having at least one safety stop hole positioned nearest to the terminal end of the upper slider member channel therein, said hole disposed below and opposing said continuous flange; wherein the upper platforms is held securely together with the lower box as a result of the upper slider member of the slider member channel assembly being fastened to the upper platform and the lower slider member of the slider member channel assembly being fastened to the lower box, and the upper slider member and the lower slider member being engaged with each other while the upper platform is in the stationary or transitional mode; and
    at least one latch fastened adjacent to each said upper box side edge and extending downward to releasably engage a respective one of said lower box latch receptacles.

2. The case of claim 1 wherein the slider assembly comprises a first or upper slider member channel telescopically and frictionally engaged in the second or lower slider member channel opposed to the inside surface, said upper slider member channel slidable between a retracted position and an extended position, said lower slider member channel including a biased stop member mounted on the top planar surface of sides of the lower box extending there-through the lower slider member channel in proximity to provide contact with upper slider member channel when the upper slider member channel is in an extended position by telescopic movement and thereby resist return movement of the upper slider member channel toward the retracted position.

3. The case of claim 2 wherein the upper slider member channel comprises a plurality of said safety stop concave holes which are arranged linearly and parallel to said continuous flange within each respective said upper slider member channel.

4. The case of claim 3 wherein a plurality of said safety stop concave holes are arranged linearly and parallel to said continuous flange within each respective slider member channel.

5. The case of claim 4 wherein said linearly arranged safety stop concave holes are distributed along a two-third length of said slider member channel nearest to the terminal end containing the stop hole.

6. The case of claim 2 wherein lower slider member channels comprise a generally planar center web with an outside surface and an inside surface, said center web having an end comprising a stop.

7. The case of claim 2 wherein each of said upper slider member channel comprises having a center web and angled flange which are in opposed, generally parallel relation to one another and slide longitudinally with respect to each other as the channels slide.

8. The case of claim 2 wherein each said lower slider member channels extend along approximately the entire length of a respective said lower box side edge.

9. The case of claim 2 wherein the upper and lower slider member channel comprise of material comprising of extruded aluminum or other light, strong material that can be affixed to the top planar surface of the sides of the lower box and the side planar surface of the upper platform.

10. The case of claim 1 wherein the slider member channel assembly comprises an engagement mechanism having a cantilever spring lever mounted on the top side edge of the lower box, said lever having a first end attached to the said box and a second end comprising the prong and manual actuation surface extending beyond the lower slider member channel via hole disposed therein.

11. The case of claim 10 wherein the cantilever spring member comprises an elongate plate member with the elongate dimension aligned in the direction of the second slider member channel movement to engage the slide stop member.

12. The case of claim 11 wherein the elongate plate member attaches to the side wall of lower box at a fixed end of the plate member and having an unattached opposite end with an elongate dimension in the direction of the upper slider member channel, and including said prong projecting toward the slide path of the upper slider member channel, and biased by said elongate plate member in the opposite direction from said prong to normally maintain the prong out of the pathway of the upper slider member channel.

13. The case of claim 11 wherein said cantilever spring lever comprises a material for lever comprising of stainless steel, aluminum, bronze, iron, low and high carbon steels, and other materials suitable for the application.

14. The case of claim 1 wherein the slider member channel assembly comprises a stop member having a cantilever biased stop member having a first end mounted to the lower box and extending there-through said lower slider member channel via hole with a spring mechanism biasing the upper slider member channel engaging end into the upper slider member channel path of the upper slider member channel when the upper slider member channel is in the extended position.

15. The case of claim 1 wherein the slider member channel assembly comprises a spring and metal ball assembly which is tightly fitted in an hole sufficient to hold said spring in the top planar surface of the box sides and said assembly is recessed but slightly protruding there-through the lower slider member channel to frictionally engage said safety stop hole and the bottom flange portion of said upper slider member channel to allow a smooth and fluid movement of the upper platform.

16. The case of claim 15 wherein the spring and metal ball assembly comprises a material for the spring comprising of aluminum, bronze, low and high carbon steels, and other high tensile materials containing sufficient compression for the application.

17. The case of claim 1 wherein each said upper slider member channel is substantially shorter in the longitudinally axial direction than said lower slider member channels.

18. The case of claim 1 wherein said upper platform member fastens to the horizontal flanges there-between of said upper slider member channels in a horizontal position.

19. The case of claim 1 wherein said upper slider member channels having opposite axial ends.

20. The case of claim 19 wherein said upper slider member channels are spaced apart axially from each other.

21. The case of claim 1 wherein said lower slider member channels having opposite axial ends.

22. The case of claim 21 wherein said lower slider member channels are spaced apart axially from each other.

23. For platform and box combination case having an upper and lower boxes with an upper platform, said case housing audio and electronic equipments, a method for providing in said case variably adjustable upper platform for the placement of additional gears or electronic devices without occupying additional space than in the typical DJ boxes, said method comprising the steps of:
  providing a lower box having an open top and side edge defining a border of said top of each of two side surfaces, said box containing at least one audio equipment device;
  providing at least one upper platform having a bottom surface and a side edge defining a border of said bottom surface on each of two side surfaces of said upper platform, said upper platform containing at least one electronic device capable of operating with said lower box device;
  providing an upper box having an open bottom and side edge defining a border of said bottom on each of two side surfaces, said box contains a concave space for housing at least one electronic device when in a closed position;
  providing at least one latch fastened adjacent to each said upper box side edge and extending downward to releasably engage a respective one of said lower box latch receptacles;
  providing a lower box having a lower slider member channel fastened to each upper side edge thereof, said member having a continuous flange projecting therefrom and a recessed hole positioned therein, said spring loaded metal ball extending there-through said lower slider member channel in stationary and transitional positions, a stop hole positioned therein near the extreme end of said member, said cantilever spring lever extending there-through said slider member channel when in use;
  providing an upper platform contained within the enclosure box having an upper slider member channel fastened to side thereof, said upper slider member channel having a continuous web channel projecting downward therefrom and a stop hole positioned therein, said spring loaded metal ball frictionally engaged with said upper slider member channel when in stationary and transitional positions;
  means for shifting said upper platform along said lower box in a rearward or forward direction in a continuously variable path within a limit of travel determined by said safety cantilever spring stop member until said audio or electronic equipment in said lower box is exposed to the satisfaction of said operator and simultaneously allow the placement of computers or other accessories on the upper platform to constitute an operating mode position; and
  means for frictionally engaging said upper and lower slider member channels, thereby securing said upper platform in said operating position.

* * * * *